(12) United States Patent
Wu et al.

(10) Patent No.: US 10,847,463 B2
(45) Date of Patent: Nov. 24, 2020

(54) SEED LAYERS FOR COPPER INTERCONNECTS

(71) Applicant: Applied Materials, Inc., Santa Clara, CA (US)

(72) Inventors: Zhiyuan Wu, San Jose, CA (US); Meng Chu Tseng, Saratoga, CA (US); Mehul B. Naik, San Jose, CA (US); Ben-Li Sheu, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/102,533

(22) Filed: Aug. 13, 2018

(65) Prior Publication Data

US 2019/0067201 A1 Feb. 28, 2019

Related U.S. Application Data

(60) Provisional application No. 62/548,604, filed on Aug. 22, 2017.

(51) Int. Cl.
*H01L 23/532* (2006.01)
*H01L 21/768* (2006.01)

(52) U.S. Cl.
CPC .. *H01L 23/53238* (2013.01); *H01L 21/76846* (2013.01); *H01L 21/76873* (2013.01); *H01L 21/76876* (2013.01); *H01L 2221/1089* (2013.01); *H01L 2924/01029* (2013.01); *H01L 2924/01044* (2013.01)

(58) Field of Classification Search
CPC ......... H01L 23/53238; H01L 21/76876; H01L 2221/1084; H01L 2221/1089; H01L 21/76871–76876; H01L 21/76846

USPC ......... 257/753, 751, E21.584; 438/643, 644, 438/627, 628
See application file for complete search history.

(56) References Cited

U.S. PATENT DOCUMENTS

| | | | |
|---|---|---|---|
| 2004/0188850 A1 | 9/2004 | Lee et al. | |
| 2004/0241321 A1* | 12/2004 | Ganguli | H01L 21/76873 427/255.28 |
| 2006/0199372 A1* | 9/2006 | Chung | H01L 21/28556 438/628 |
| 2008/0164613 A1 | 7/2008 | Edelstein et al. | |
| 2009/0087982 A1 | 4/2009 | Wang et al. | |
| 2009/0321935 A1 | 12/2009 | O'Brien et al. | |

(Continued)

FOREIGN PATENT DOCUMENTS

CN 103266304 A 8/2013
WO 2009146423 A1 12/2009

OTHER PUBLICATIONS

EPO Extended European Search Report dated Dec. 17, 2018, for European Application No. 18189568.1.

*Primary Examiner* — Mohammed Shamsuzzaman
*Assistant Examiner* — Aaron J Gray
(74) *Attorney, Agent, or Firm* — Patterson + Sheridan LLP

(57) ABSTRACT

Methods for forming a copper seed layer having improved anti-migration properties are described herein. In one embodiment, a method includes forming a first copper layer in a feature, forming a ruthenium layer over the first copper layer in the feature, and forming a second copper layer on the ruthenium layer in the feature. The ruthenium layer substantially locks the copper layer there below in place in the feature, preventing substantial physical migration thereof.

9 Claims, 3 Drawing Sheets

(56) References Cited

U.S. PATENT DOCUMENTS

| | | |
|---|---|---|
| 2010/0055433 A1 | 3/2010 | Shinriki et al. |
| 2010/0200991 A1* | 8/2010 | Akolkar ............ H01L 21/28562 |
| | | 257/751 |
| 2013/0292806 A1* | 11/2013 | Ma .................... H01L 21/76846 |
| | | 257/632 |
| 2014/0327141 A1* | 11/2014 | Yu .................... H01L 21/76871 |
| | | 257/751 |
| 2015/0262938 A1* | 9/2015 | Lin ................... H01L 21/76843 |
| | | 257/751 |
| 2016/0032455 A1 | 2/2016 | Liu et al. |

* cited by examiner

SEED LAYERS FOR COPPER INTERCONNECTS

CROSS-REFERENCE TO RELATED APPLICATIONS

This application claims benefit to U.S. Provisional Patent Application Ser. No. 62/548,604, filed on Aug. 22, 2017, which is herein incorporated by reference in its entirety.

BACKGROUND

Field

Embodiments described herein generally relate to the field of semiconductor device manufacturing, and more particularly, to methods of forming seed layers for copper interconnects.

Description of the Related Art

As circuit densities increase for next generation devices and transistor dimensions continue to shrink, the resistance and conductivity of wire interconnects begins to dominate device performance for major device performance metrics including power consumption, resistance-capacitance (RC) delay, and reliability. Copper is one material used for wire interconnects in advanced USLI and VSLI technologies, because copper generally exhibits relatively low resistivity and high conductivity. Often, copper interconnects are formed by depositing a copper seed layer into openings formed in a material surface of a substrate before electroplating bulk copper onto the copper seed layer or before bulk copper reflow thereinto.

Typically, the copper seed layer carries the required electrical current for a subsequent electroplating process or serves as a wetting layer to promote copper reflow into the openings formed in the material surface of the substrate. Gaps in coverage of the copper seed layer on the walls or base of the openings will lead to undesirable voids in the bulk copper material of the interconnect structure. Voids or coverage gaps in the bulk copper material result in electromigration failures of copper structures, which potentially render the resulting device useless or having lessened capability. Causes of copper seed layer coverage gaps include one or both of copper agglomeration or discontinuous deposition. Copper agglomeration occurs when the deposited copper coalesces into thicker coverage in some areas by pulling copper away from surrounding areas. Discontinuous deposition on the walls of the openings is typically due to a shadowing effect inherent to the copper seed physical vapor deposition (PVD) process for some opening geometries.

Conductive liners deposited on the copper seed layer, such as a metal liner, fill gaps in coverage of the seed layer on the walls or base of the openings which reduces voids in the bulk copper material during the subsequent electroplating process. However, conductive liners disposed between the copper seed layer and the bulk copper layer undesirably create an interfacial liner/copper layer between the copper seed layer and bulk copper layer. This interfacial layer undesirably reduces the total copper line width and thus undesirably increases the line resistivity of the subsequently formed copper interconnect.

Accordingly, what is need in the art improved copper seed layers and methods of forming improved copper seed layers.

SUMMARY

The present disclosure generally describes methods of forming a ruthenium doped copper seed layer.

In one embodiment, a method of forming an interconnect structure is provided. The method comprises positioning a patterned substrate in a first processing chamber, the patterned substrate having openings formed in a material layer thereof, and forming a seed layer on walls of the openings. Forming the seed layer on the walls of the openings includes forming first copper layer, forming a ruthenium layer on the first copper layer, and forming a second copper layer on the ruthenium layer.

In another embodiment, a method of forming a device includes depositing a first copper layer on a patterned substrate, the patterned substrate comprising a material layer having openings formed therein and a barrier layer disposed on the material layer, depositing a ruthenium layer on the first copper layer, and depositing a second copper layer on the ruthenium layer. In some embodiments, the method further includes depositing a copper layer into the opening using an electrodeposition process, a reflow gap fill process, or a combination thereof.

In another embodiment, a method of forming a copper interconnect includes positioning a patterned substrate in a processing chamber, the patterned substrate having openings formed in a material layer thereof, and forming a seed layer on walls of the openings. Forming the seed layer on the walls of the openings comprises depositing a first copper layer on the patterned substrate, depositing a ruthenium layer on the first copper layer, and depositing a second copper layer on the ruthenium layer. Depositing the first copper layer comprises sequentially exposing the patterned substrate to a first reactive precursor comprising a copper-containing organometallic and a second reactive precursor comprising hydrogen. Depositing the ruthenium layer includes sequentially exposing the first copper layer to a third reactive precursor comprising a ruthenium-containing organometallic and a fourth reactive precursor comprising hydrogen. Depositing the second copper layer comprises sequentially exposing the ruthenium layer to the first reactive precursor and the second reactive precursor.

In some embodiments, the methods described herein further include depositing a copper layer into the opening using an electrodeposition process, a reflow gap fill process, or a combination thereof.

In another embodiment, a device, comprises a substrate featuring a patterned surface, the pattern surface having a plurality of openings formed in a material layer thereof, and a seed layer disposed on walls of the openings. Here, the seed layer includes a first copper layer, a ruthenium layer disposed on the first copper layer, and a second copper layer disposed on the ruthenium layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
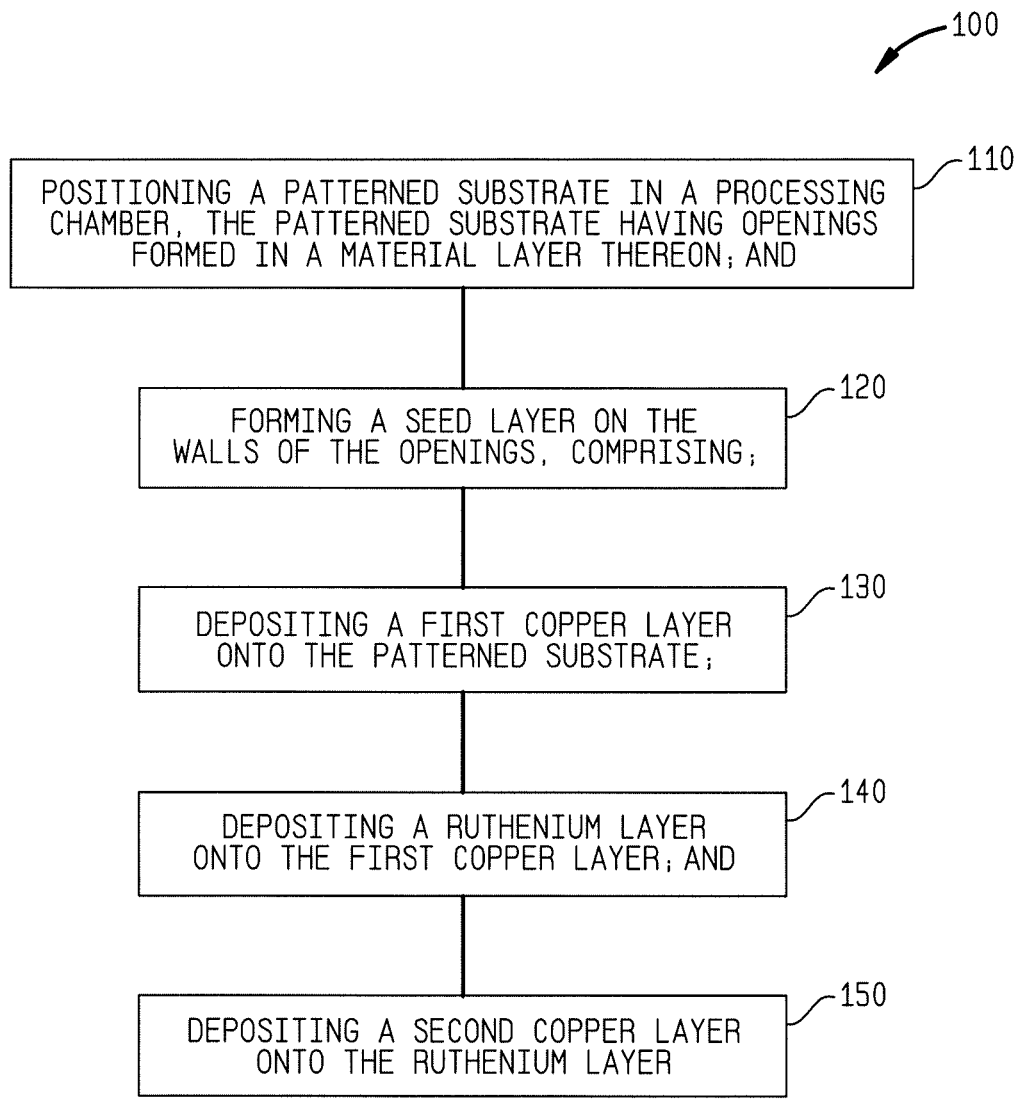
FIG. 1 is a flow diagram setting forth a method of forming a ruthenium doped copper seed layer, according to one embodiment.

Embodiments of the present disclosure generally describe methods of forming a copper interconnect structure, in particular, forming a ruthenium doped copper seed layer comprising a plurality of copper layers and at least one ruthenium layer disposed between the copper layers. The methods described herein may be performed in a physical vapor deposition (PVD) processing chamber, a chemical vapor deposition (CVD) processing chamber, an atomic layer deposition (ALD) processing chamber, or combinations thereof. In one embodiment, the PVD, CVD, and ALD processing chambers are an ENDURA® PVD processing chamber, a PRODUCER® CVD processing chamber, and an OLYMPIA® ALD processing chamber respectively, all available from Applied Materials, Inc., Santa Clara, Calif.

A ruthenium doped seed layer, formed according to the methods described herein, enables continuous seed layer coverage over the walls of interconnect openings and facilitates reducing liner thicknesses Herein, the ruthenium doped seed layer includes at least one ruthenium layer deposited between a first copper layer and a second copper layer. Typically, the first and second copper layers are deposited using a PVD process, a CVD process, or an ALD process and the ruthenium layer is deposited using a CVD process or an ALD process. Copper and ruthenium are generally not miscible with one another, thus the ruthenium layer effectively pins the copper of either the first and second layers at the grain boundaries formed therebetween and desirably locks the copper in place in the feature preventing electromigration thereof. Pinning the copper at the grain boundaries formed between the copper and ruthenium layers prevents the copper in the copper layers from moving to form undesirable copper agglomerations. Further, preventing copper electromigration using the methods set forth herein allows for increased circuit density and improved reliability by preventing device failures related thereto.

Benefits of suppressing copper agglomeration using embodiments provided herein further include enabling a reduction in the thickness of a liner layer disposed on a dielectric layer having the opening formed therein. The reduced thickness of the liner layer increases the bulk copper volume for the subsequently formed interconnect. This increase in bulk copper volume desirably reduces line resistance in the opening. Pinning the copper layer desirably eliminates gaps in coverage on the walls of interconnect feature openings. Eliminating coverage gaps caused by copper migration desirably eliminates or reduces voids formed in the bulk copper material of the copper interconnect during a subsequent electrodeposition or reflow/gap fill process. Beneficially, ruthenium diffuses more slowly into copper than other dopants, such as cobalt or manganese, so that by using ruthenium in the seed layer, the line resistance of the bulk copper layer is not negatively impacted. Further, the ruthenium doped seed layers formed according to embodiments described provide a relativity thin and continuous surface to facilitate a subsequent copper reflow/gap fill process.

FIG. 1 is a flow diagram setting forth a method of forming a ruthenium doped copper seed layer, according to one embodiment. FIGS. 2A-2E illustrate elements of the method set forth in FIG. 1.

Figure 2A:
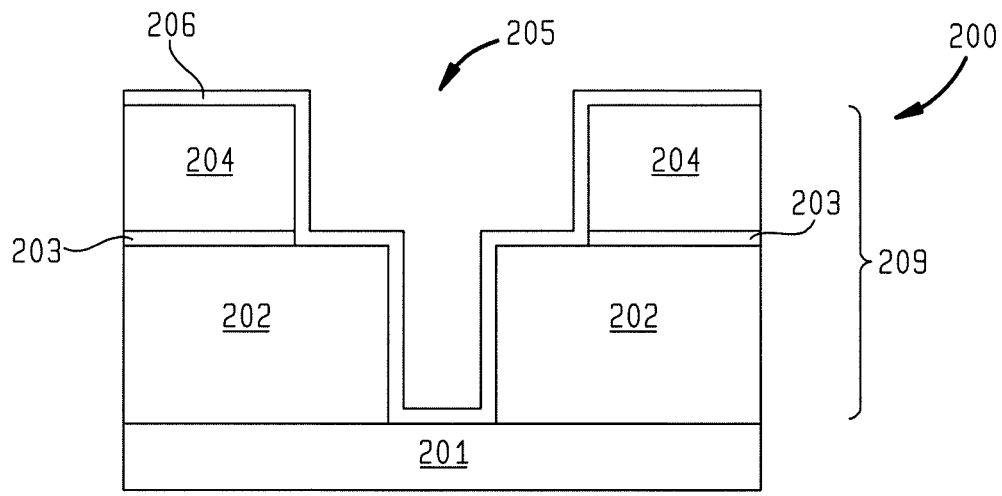
FIGS. 2A-2E illustrate elements of the method set forth in FIG. 1, according to one embodiment.

At activity 110 the method 100 includes positioning a patterned substrate in a processing chamber. A patterned substrate 200 is illustrated in FIG. 2A and it includes a substrate 201, a material layer 209 formed on the substrate 201, one or more openings 205 formed in the material layer 209, and a barrier layer 206 disposed on, and lining the openings 205 of, the material layer 209. Herein, the material layer 209 comprises one or more dielectric layers, such as a first dielectric layer 202 and a second dielectric layer 204. Typically, the one or more dielectric layers 202, 204 are formed of a material selected from the group consisting of silicon oxides, SiN, SiOC, SIC, low-k polymers, such as a polyamide, and combinations thereof.

In some embodiments, the material layer 209 further comprises an etch stop layer 203 disposed between the first dielectric layer 202 and the second dielectric layer 204. The barrier layer 206, disposed on the material layer 209, prevents diffusion of copper atoms from subsequently deposited copper layers into the surrounding dielectric layers 202, 204. Typically, the barrier layer 206 comprises one or more of a metal, a metal nitride, a metal alloy, or a combination thereof. In some embodiments, the barrier layer 206 is selected from the group consisting of tantalum, tantalum nitride, tungsten, titanium, titanium tungsten, titanium nitride, tungsten nitride, titanium copper, and combinations thereof. In some embodiments, the barrier layer comprises tantalum nitride. The barrier layer 206 is deposited using any suitable method such as chemical vapor deposition (CVD), physical vapor deposition (PVD), atomic layer deposition (ALD), or combinations thereof.

Figure 2B:
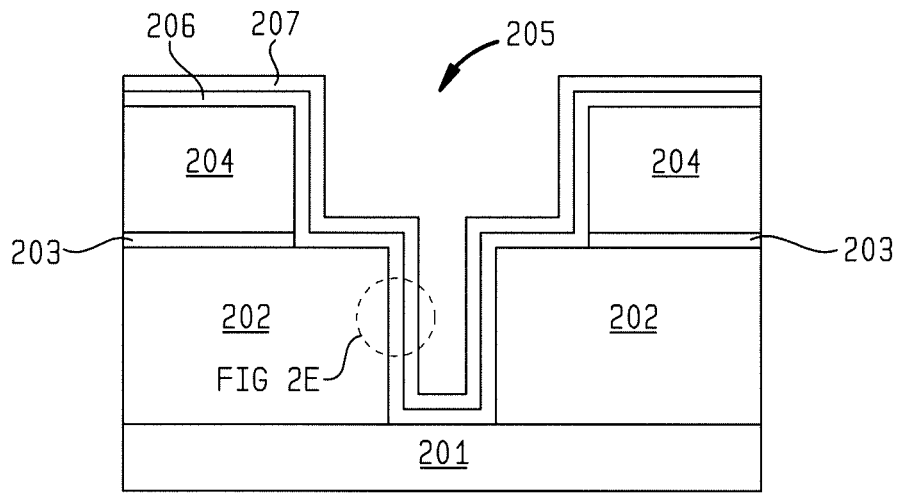
Figure 2C:
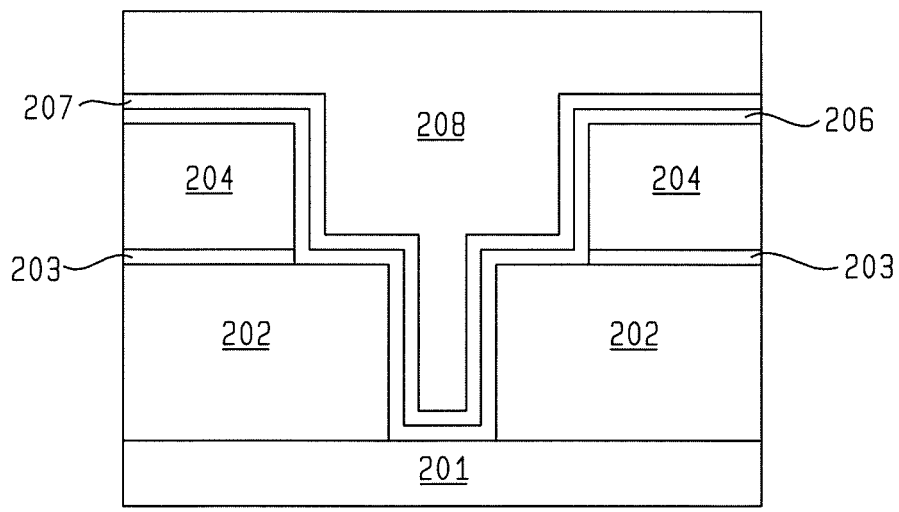

At activity 120 the method 100 includes forming a seed layer 207 on the barrier layer 206. FIG. 2B illustrates a seed layer 207 deposited on the barrier layer 206 of the patterned substrate 200. FIG. 2E is a close up view of a portion of FIG. 2B.

At activity 130 the method 100 includes depositing a first copper layer 207a on the barrier layer 206 of the patterned substrate 200. The first copper layer 207a herein is deposited using an atomic layer deposition (ALD) process which includes sequentially exposing the patterned substrate 200 to a first reactive precursor comprising a copper-containing organometallic and a then second reactive precursor comprising a hydrogen containing gas to form a copper film. Examples of copper-containing organometallic gases include bis(diethylamino-2-n-butoxy)copper (Cu(DEAB)2), bis(ethylmethylamino-2-n-butoxy)copper, bis(dimethylamino-2-propoxy)copper (Cu(DMAP)2), bis(dimethylamino-2-n-butoxy)copper (Cu(DMAB)2), bis(dimethylamino-2-ethoxy)copper, bis(ethymethylamino-2-propoxy) copper (Cu(EMAP)2), bis(diethylamino-2-ethoxy)copper, bis(ethylmethylamino-2methyl-2-n-butoxy)copper, bis(dimethylamino-2-methyl-2-propoxy)copper, bis(diethylamino-2-propoxy) copper (Cu(DEAP)2), bis(2-methoxyethoxy)copper, bis(2,2,6,6-tetramethyl-3,5-heptanedionate) copper, bis(2,2,6,6-tetramethyl-3,5-heptaneketoiminate) copper, bis(2-methoxy-2-propoxy)copper, and 2,2,6,6-tetramethyl-3,5-heptanedionate copper (TMVS), and combinations thereof. Examples of the hydrogen containing precursor include H2, NH3, and combinations thereof. In some embodiments, the processing volume is purged between alternating exposures of the first and second precursors using an inert gas, such as argon.

In some embodiments, the processing chamber is maintained at a pressure of between about 1 Torr and about 30 Torr and the patterned substrate is maintained a temperature between about 50° C. and about 400° C. during the deposition of the first copper layer 207a. Flowrates for the first and second reactive precursor are typically between about 3000 sccm and about 9000 sccm for a processing chamber configured to process 300 mm diameter substrates and are scaled appropriately for different sized substrates. In some embodiments, the processing chamber is a plasma enhanced processing chamber where an electrode disposed in the processing chamber is coupled to a plasma power supply. The plasma power supply provides between about 100 W and 1000 W, such as about 400 W at a frequency of 13.56 MHz, to ignite and maintain the precursors into a processing plasma. In some embodiments, the first copper layer 207a has a copper purity of greater than about 99%. In other embodiments, the first copper layer is deposited using a physical vapor deposition (PVD) or a chemical vapor deposition (CVD) process. For example, in one embodiment the first copper layer 207a is deposited using a PVD process where the target is a pure copper target or a copper alloy target, such as a Cu—Al target comprising between about 0.1% and about 3% Al or a Cu—Mn target comprising between about 0.1% and about 3% Mn. In that embodiment, the target is coupled to a DC power of between about 20 kW and about 40 kW and the substrate is coupled to an AC bias power of between about 50 W and about 1500 W. In another embodiment, the first copper layer 207a is deposited using a CVD or PVD process.

At activity 140 the method 100 includes depositing a ruthenium layer 207b onto the first copper layer 207a. Here, the ruthenium layer 207b is deposited in the same processing chamber used to deposit the first copper layer 207a. Typically, the processing chamber is purged between depositing the first copper layer 207a and depositing the ruthenium layer, using an inert gas such as argon. In some embodiments, the ruthenium layer 207b is deposited using an ALD process which includes alternating sequentially exposing the patterned substrate 200, having the first copper layer 207a deposited thereon, to a third reactive precursor comprising a ruthenium-containing organometallic and then a fourth reactive precursor comprising hydrogen, such as hydrogen gas. Examples of ruthenium-containing organometallics include methyl-cyclohexadine ruthenium tricarbonylcyclohexadine, ruthenium tricarbonyl, butadiene ruthenium tricarbonyl, dimethyl butadiene ruthenium tricarbonyl, modified dines with Ru(CO)3, and combinations thereof.

Typically, during deposition of the ruthenium layer 207b, the processing chamber is maintained at a pressure between about 1 Torr and about 50 Torr and the patterned substrate is maintained a temperature between about 100° C. and about 400° C. Flowrates for the third and fourth reactive precursors are between about 3000 sccm and about 9000 sccm for an ALD processing chamber configured to process 300 mm diameter substrates and are scaled appropriately for different sized substrates. In some embodiments, an electrode disposed in the processing chamber is coupled to a plasma power supply that provides between about 100 W and 1000 W, such as about 400 W at a frequency of 13.56 MHz which ignites and maintains a processing plasma of the precursor gases disposed therein. In some embodiments, the processing volume is purged between alternating exposures of the third and fourth precursors using an inert gas, such as argon. In other embodiments, the ruthenium layer 207b is deposited using a CVD process and/or is deposited in a different processing chamber than that used to form the first copper layer 207a. In other embodiments, the ruthenium layer 207b is deposited using a PVD process.

At activity 150 the method 100 includes depositing a second copper layer 207c on the ruthenium layer 207b. In some embodiments, the second copper layer 207c is deposited in the same processing chamber as was used to form the first copper layer 207a at activity 130 and the ruthenium layer 207b at activity 140. In some embodiments, the second copper layer 207c is deposited using the same process used to from the first copper layer 207a at activity 130. Typically, the ALD processing chamber is purged with an inert gas, such as argon, between depositing the ruthenium layer 207b and the second copper layer 207c. In other embodiments, the second copper layer 207c is deposited using a PVD process or a CVD process in a chamber that is different from the chamber used to form the first copper layer 207a and/or the ruthenium layer 207b. In some embodiments, the processing chambers used to form the barrier layer 206, the copper layers 207a, 207c, and/or the ruthenium layer 207b are connected together under vacuum or a controlled environment by a transfer chamber which is maintained at sub-atmospheric pressures to prevent surface oxidation of the deposited layers before formation of a subsequent layer thereon.

Herein, the barrier layer 206 has a first thickness T(1) between about 0.5 nm and about 20 nm, such as between about 1 nm and about 5 nm, for example about 2 nm. The first copper layer 207a has a second thickness T(2) between about 0.5 nm and about 20 nm, such as between about 0.5 nm and about 10 nm, such as between about 0.5 nm and about 5 nm, for example about 4 nm. The ruthenium layer 207b has a third thickness T(3) between about 1 angstrom (Å) and about 20 Å, such as between about 1 Å and about 15 Å, such as between about 1 Å and about 10 Å. The second copper layer 207c has a fourth thickness T(4) between about 0.5 nm and about 200 nm, such as between about 1 nm and about 20 nm, or between about 1 nm and about 5 nm, for example about 2 nm. Typically, the ratio of copper to ruthenium in the seed layer 207 is between about 99.9:1 and about 4:1, where the thicknesses T(2), T(3), and T(4) of the respective copper and ruthenium layers 207a, 207b, and 207c is adjusted to increase or decrease the concentration of ruthenium in the seed layer.

In some embodiments, forming the seed layer 207 comprises sequentially depositing a plurality of first copper layers 207a and ruthenium layers 207b before depositing the second and final copper layer 207c.

Figure 2D:
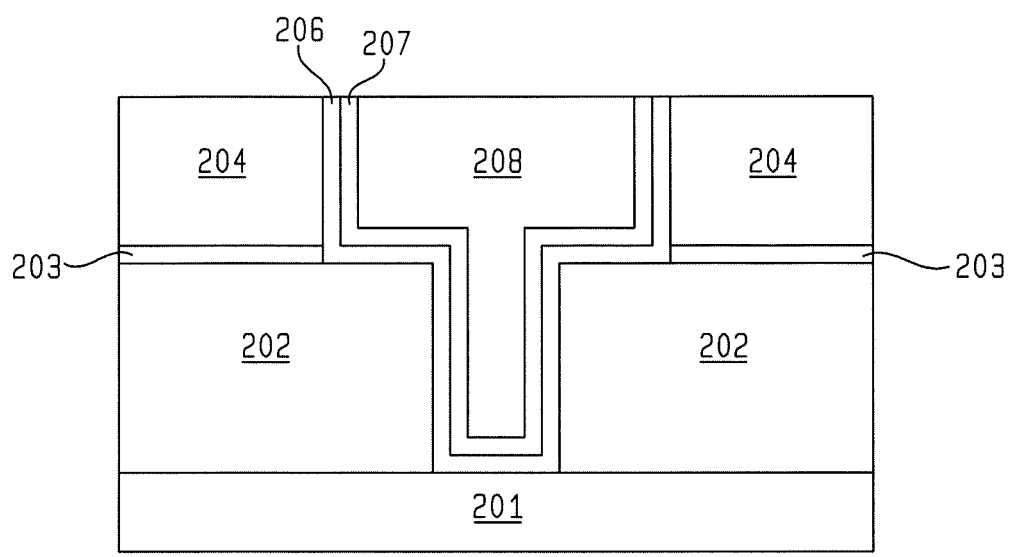
Figure 2E:
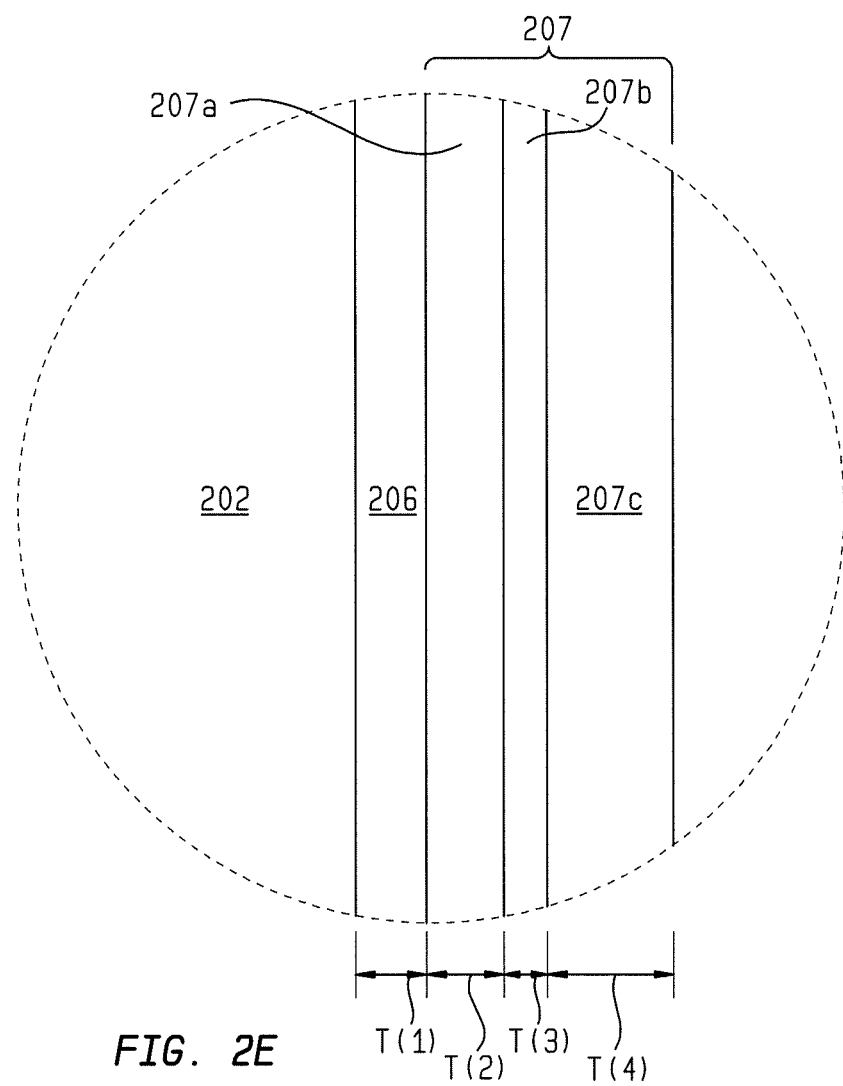

FIGS. 2D and 2E further illustrate the formation of a copper interconnect. FIG. 2D shows a bulk copper layer 208 deposited on the seed layer using an electroplating process or a copper reflow/gap fill process, e.g., a thermal assisted reflow process. The bulk copper layer 208 is then removed from the surface of the substrate using a bulk film removal process, such as chemical mechanical planarization (CMP), to form a copper interconnect structure, such as the interconnect structure shown in FIG. 2D.

Benefits of the methods described herein include suppressed copper agglomeration during formation of the seed layer, reduction in the minimum seed layer thickness required for continuous coverage thereof, improved reflow fill with thinner seed layer, and improved line and/or via resistance of a copper interconnect formed thereon. Further, in addition to suppressed copper agglomeration, benefits of embodiments herein include suppressed copper electromigration which allows for increased circuit density and improved reliability and/or useful lifetime by preventing device failures related thereto.

While the foregoing is directed to embodiments of the present disclosure, other and further embodiments of the disclosure may be devised without departing from the basic scope thereof, and the scope thereof is determined by the claims that follow.

The invention claimed is:

1. A method of forming an interconnect structure, comprising:
   positioning a substrate in a first processing chamber, the substrate comprising a patterned surface having openings formed in a material layer thereof;
   depositing, in the first processing chamber, a tantalum nitride layer on the material layer to line the openings;
   positioning the substrate in a second processing chamber; and
   forming a seed layer on the tantalum nitride layer without removing the substrate from the second processing chamber, comprising:
      alternating sequentially exposing the substrate to a first reactive precursor comprising a copper-containing organometallic and a second reactive precursor comprising hydrogen to form a first copper layer;
      alternating sequentially exposing the substrate to a third reactive precursor comprising a ruthenium-containing organometallic and a fourth reactive precursor comprising hydrogen to form a ruthenium layer on the first copper layer; and
      alternating sequentially exposing the substrate to the first reactive precursor and the second reactive precursor to form a second copper layer on the ruthenium layer,
   wherein the first processing chamber and the second processing chamber are connected together by a transfer chamber, the first copper layer has a first thickness between 0.5 nm and 5 nm, the ruthenium layer has a second thickness between 1 angstrom and 10 angstroms, the second cooper layer has a third thickness between 1 nm and 20nm, the tantalum nitride layer has a fourth thickness between 1 nm and 5 nm.

2. The method of claim 1, further comprising sequentially forming a plurality of alternating first copper and ruthenium layers before forming the second copper layer.

3. A method of forming a interconnect structure, comprising:
   positioning a substrate in a first processing chamber, the substrate comprising a patterned surface having openings formed in a material layer thereof;
   depositing, in the first processing chamber, a tantalum nitride layer on the material layer to line the openings, wherein the tantalum nitride layer is deposited to a first thickness of between 1 nm and 5 nm;
   positioning the substrate in a second processing chamber;
   forming a seed layer on the tantalum nitride layer without removing the substrate from the second processing chamber, comprising:
      (a) depositing a first copper layer on the substrate by alternating sequentially exposing the patterned substrate to a first reactive precursor comprising a copper-containing organometallic and a second reactive precursor comprising hydrogen, wherein the first copper layer is deposited to a second thickness of between 0.5 nm and 20 nm;
      (b) depositing a ruthenium layer on the first copper layer by alternating sequentially exposing the substrate to a third reactive precursor comprising a ruthenium-containing organometallic and a fourth reactive precursor comprising hydrogen, wherein the ruthenium layer is deposited to a third thickness of between 1 angstrom and 10angstroms; and
      (c) repeating (a) and (b); and
   depositing a second copper layer on the seed layer, wherein the second copper layer is deposited to a fourth thickness between 1 nm and 20 nm, wherein the first processing chamber and the second processing chamber are connected together by a transfer chamber.

4. The method of claim 3, wherein the material layer comprises a dielectric layer.

5. The method of claim 3, wherein depositing the second copper layers comprises sequentially exposing the patterned substrate to a first reactive precursor comprising a copper-containing organometallic and a second reactive precursor comprising hydrogen.

6. The method of claim 3, wherein depositing the second copper layers comprises a PVD process, and wherein depositing the ruthenium layer comprises sequentially exposing the patterned substrate to a first reactive precursor comprising a ruthenium-containing, organometallic and a second reactive precursor comprising hydrogen.

7. A method of forming an interconnect structure, comprising:
   positioning a substrate in a first processing chamber, the substrate comprising a patterned surface having openings formed in a material layer thereof;
   depositing, in the first processing chamber, a tantalum nitride layer on the material layer to line the openings;
   positioning the substrate in a second processing chamber:
   forming a seed layer on the tantalum nitride layer, comprising:
      sequentially forming a plurality of alternating first copper and ruthenium layers; and
      forming a second copper layer on a ruthenium layer of the plurality of alternating first copper and ruthenium layers, wherein
      the first copper layers, the ruthenium layers, and the second copper layer are sequentially deposited in the second processing chamber without removing the substrate therefrom,
      forming the first and second copper layers comprises alternating sequentially exposing the substrate to a first reactive precursor comprising a copper-containing organometallic and a second reactive precursor comprising hydrogen, and
      forming the ruthenium layer comprises alternating sequentially exposing the substrate to a third reactive precursor comprising a ruthenium-containing organometallic and a fourth reactive precursor comprising hydrogen.

8. The method of claim 7, wherein
   the tantalum nitride layer has a first thickness of between 1 nm and 5 nm,
   one or more of the first copper layer are deposited to a second thickness of between 0.5 nm and 5 nm;
   one or more of the ruthenium layer are deposited to a third thickness of between 1 angstrom and 10 angstroms; and
   the second copper layer is deposited to a fourth thickness between 1 nm and 20 nm.

9. The method of claim 7, wherein the first processing chamber and the second processing chamber are connected together by a transfer chamber.

* * * * *

UNITED STATES PATENT AND TRADEMARK OFFICE
CERTIFICATE OF CORRECTION

PATENT NO. : 10,847,463 B2
APPLICATION NO. : 16/102533
DATED : November 24, 2020
INVENTOR(S) : Zhiyuan Wu et al.

Page 1 of 1

It is certified that error appears in the above-identified patent and that said Letters Patent is hereby corrected as shown below:

In the Specification

In Column 4, Line 54, delete "bis(ethymethylamino-" and insert -- bis(ethylmethylamino- --, therefor.

In Column 4, Line 56, delete "-2methyl-" and insert -- -2-methyl- --, therefor.

In Column 5, Line 45, delete "methyl-cyclohexadine" and insert -- methyl-cyclohexadiene --, therefor.

In Column 5, Line 45, delete "tricarbonylcyclohexadine," and insert -- tricarbonylcyclohexadiene, --, therefor.

In the Claims

In Column 7, Line 37, in Claim 1, delete "cooper" and insert -- copper --, therefor.

In Column 7, Line 38, in Claim 1, delete "20nm," and insert -- 20 nm, --, therefor.

In Column 8, Line 4, in Claim 3, delete "10angstroms;" and insert -- 10 angstroms; --, therefor.

In Column 8, Line 22, in Claim 6, delete "ruthenium-containing," and insert -- ruthenium-containing --, therefor.

In Column 8, Line 31, in Claim 7, delete "chamber:" and insert -- chamber; --, therefor.

Signed and Sealed this
Eighteenth Day of May, 2021

Drew Hirshfeld
*Performing the Functions and Duties of the*
*Under Secretary of Commerce for Intellectual Property and*
*Director of the United States Patent and Trademark Office*